(12) United States Patent  
Lind

(10) Patent No.: US 9,964,332 B2  
(45) Date of Patent: May 8, 2018

(54) SYSTEMS AND METHODS FOR BULK VAPORIZATION OF PRECURSOR

(71) Applicant: Lam Research Corporation, Fremont, CA (US)

(72) Inventor: Gary Lind, Nevada City, CA (US)

(73) Assignee: LAM RESEARCH CORPORATION, Fremont, CA (US)

( * ) Notice: Subject to any disclaimer, the term of this patent is extended or adjusted under 35 U.S.C. 154(b) by 476 days.

(21) Appl. No.: 14/227,503

(22) Filed: Mar. 27, 2014

(65) Prior Publication Data

US 2015/0276264 A1  Oct. 1, 2015

(51) Int. Cl.
*C23C 16/448* (2006.01)
*C23C 16/455* (2006.01)
*F24H 9/00* (2006.01)

(52) U.S. Cl.
CPC .......... *F24H 9/00* (2013.01); *C23C 16/4482* (2013.01); *C23C 16/45591* (2013.01)

(58) Field of Classification Search
CPC .. C23C 16/4482; C23C 16/45591; F24H 9/00
USPC ............. 122/459, 5.51, 5, 31.1, 234, 21; 427/248.1, 255.28; 438/680, 681
See application file for complete search history.

(56) References Cited

U.S. PATENT DOCUMENTS

| | | | | |
|---|---|---|---|---|
| 2,405,494 A * | 8/1946 | Dupuy | ................. | F24F 6/12 261/120 |
| 3,404,210 A * | 10/1968 | Weber | ................. | C03B 37/083 373/119 |
| 4,962,297 A * | 10/1990 | Lowenberg | .............. | H05B 3/70 219/448.11 |
| 5,133,284 A * | 7/1992 | Thomas | ............ | C23C 16/45521 118/715 |
| 5,451,258 A * | 9/1995 | Hillman | .............. | C23C 16/4485 118/715 |
| 5,480,678 A * | 1/1996 | Rudolph | ................ | C04B 35/83 118/715 |
| 6,444,043 B1 * | 9/2002 | Gegenwart | .......... | C23C 14/243 118/726 |
| 6,453,992 B1 * | 9/2002 | Kim | ................. | C23C 16/45565 118/666 |
| 7,959,994 B2 | 6/2011 | Spohn et al. | | |
| 8,114,479 B2 | 2/2012 | Spohn et al. | | |
| 2003/0053799 A1 * | 3/2003 | Lei | ..................... | C23C 16/4481 392/388 |
| 2004/0050492 A1 * | 3/2004 | Tsuei | ................ | C23C 16/45565 156/345.33 |

(Continued)

FOREIGN PATENT DOCUMENTS

EP          1932942 A2 *  6/2008
KR    20120131947 A  * 12/2012

*Primary Examiner* — Alissa Tompkins
*Assistant Examiner* — Benjamin W Johnson

(57) ABSTRACT

A vaporization system for liquid precursor includes a bubbler portion configured to store liquid precursor and to supply carrier gas into the liquid precursor to vaporize the liquid precursor to generate vaporized precursor. A baffle portion is arranged in fluid communication with the bubbler portion and includes N heated baffles, where N is an integer greater than or equal to one. The vaporized precursor generated by the bubbler portion passes through the N heated baffles before flowing to a substrate processing system.

33 Claims, 8 Drawing Sheets

(56) References Cited

U.S. PATENT DOCUMENTS

2013/0034621 A1\* 2/2013 Spuller ............... B29C 45/2737
       425/143

\* cited by examiner

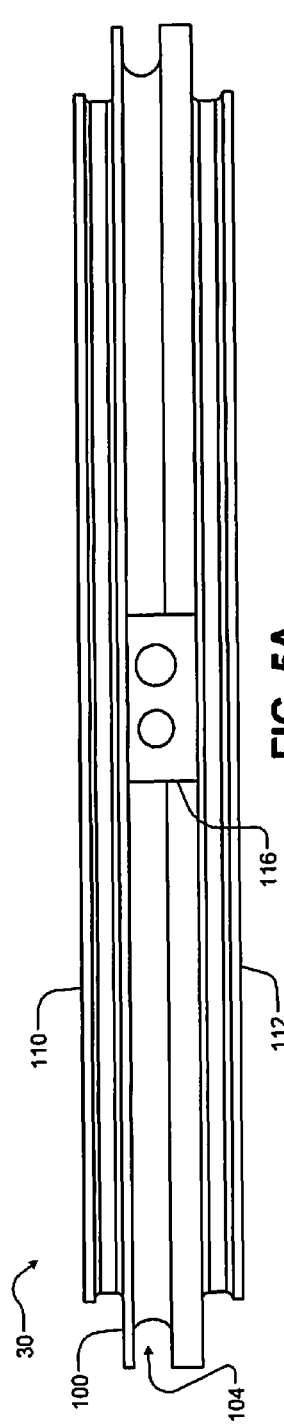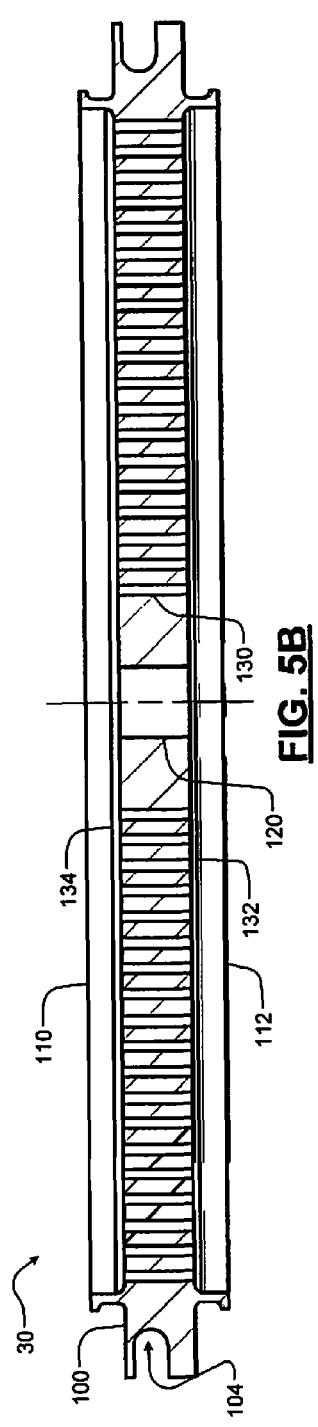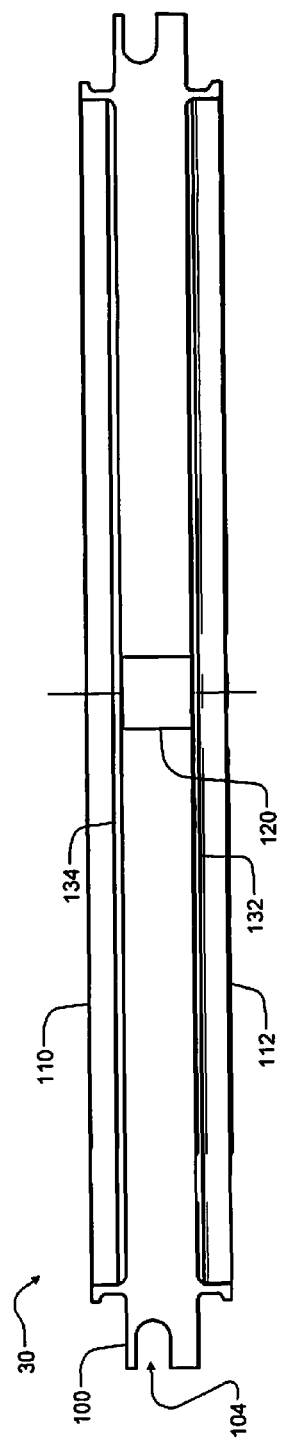

SYSTEMS AND METHODS FOR BULK VAPORIZATION OF PRECURSOR

FIELD

The present disclosure relates to substrate processing systems and more particularly to systems and methods for bulk vaporization of precursor in substrate processing systems.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Substrate processing systems are used to deposit and/or etch film on a substrate such as a semiconductor wafer. For example, the substrate processing system may perform chemical vapor deposition (CVD), plasma-enhanced (PE) CVD, atomic layer deposition (ALD), PEALD, etc. Deposition or etching may be performed by supplying a gas mixture including one or more reactants to a processing chamber.

To use liquid precursors as reactants in CVD and/or ALD type processes, the liquid precursor is initially vaporized and then transported to a surface of the substrate. The vaporized precursor should not contain any liquid droplets and should have a uniform concentration and accurate dose. Two basic methods are commonly used for vaporizing precursor. For example, a bubbler bubbles a carrier gas through liquid precursor usually at an elevated temperature. The liquid precursor evaporates and is carried away with the carrier gas. However, the bubbler provides a variable exposure surface of the carrier gas to the liquid precursor depending on flow and a liquid level in the bath, which causes variable vapor concentrations. The act of bubbling can also cause droplets and/or foam to form and may cause liquid to be transported by the vaporized precursor to the surface of the substrate.

Alternately, an evaporator may be used. In the evaporator, a small amount of liquid precursor flows onto a heated surface. The liquid precursor evaporates and is carried away via a pressure differential or using a carrier gas. However, the evaporator feeds liquid from a bulk source in very small amounts. The low flow rate is difficult to meter and deliver accurately. A liquid delivery system typically includes a liquid flow controller and a capillary tube. The liquid delivery system is subject to blockage and bubbles forming in the liquid, which also causes the vapor delivery concentration to vary.

SUMMARY

A vaporization system for liquid precursor includes a bubbler portion configured to store liquid precursor and to supply carrier gas into the liquid precursor to vaporize the liquid precursor to generate vaporized precursor. A baffle portion is arranged in fluid communication with the bubbler portion and includes N heated baffles, where N is an integer greater than or equal to one. The vaporized precursor generated by the bubbler portion passes through the N heated baffles before flowing to a substrate processing system.

In other features, N is greater than one and each of the N heated baffles comprises a temperature sensor and a heater. A controller is configured to control a temperature of each of the N heated baffles. The controller is configured to control a temperature of the bubbler portion.

In other features, the controller is configured to control the temperatures of each of the N heated baffles such that a first one of the N heated baffles has a first temperature that is less than a second temperature of a second one of the N heated baffles arranged immediately adjacent to the first one of the N heated baffles. The second temperature is less than a third temperature of a third one of the N heated baffles arranged immediately adjacent to the second one of the N heated baffles.

In other features, a porous medium is arranged adjacent to a bottom portion of the body to define a cavity. The carrier gas is delivered into the cavity between the porous medium and the bottom portion. A bracket secures the porous medium in a spaced relationship with the bottom portion of the body to define the cavity.

In other features, a first one of the N heated baffles comprises a baffle body and a first pattern of bores through the baffle body. A second one of the N heated baffles is arranged adjacent to the first one of the N heated baffles and comprises a baffle body and a second pattern of bores through the baffle body. The first pattern of bores does not align with the second pattern of bores.

In other features, the first one of the N heated baffles further comprises first and second flanges that extend axially outwardly from the baffle body. The first one of the N heated baffles further comprises a groove that is arranged around a periphery of the baffle body and that is configured to receive a heater coil.

In other features, the first one of the N heated baffles further comprises a bore that is arranged at a center of the body and that is configured to receive a conduit for the carrier gas.

A method for vaporizing liquid precursor includes supplying liquid precursor to a bubbler portion; supplying carrier gas into the liquid precursor to vaporize the liquid precursor and to generate vaporized precursor; arranging a baffle portion including N heated baffles in fluid communication with the bubbler portion to receive the vaporized precursor, wherein N is an integer greater than or equal to one; and passing the vaporized precursor generated by the bubbler portion through the N heated baffles before flowing the vaporized precursor to a substrate processing system.

In other features, N is greater than one and the method further comprises sensing a temperature of each of the N heated baffles. The method includes selectively heating each of the N heated baffles to control the temperature based on the sensed temperature.

In other features, the method includes controlling the temperatures of each of the N heated baffles such that a first one of the N heated baffles has a first temperature that is less than a second temperature of a second one of the N heated baffles arranged immediately adjacent to the first one of the N heated baffles. The second temperature is less than a third temperature of a third one of the N heated baffles arranged immediately adjacent to the second one of the N heated baffles.

In other features, the method includes arranging a porous medium adjacent to a bottom portion of the body and delivering the carrier gas between the porous medium and the bottom portion. The method includes securing the porous medium in a spaced relationship with the bottom portion of the body.

In other features, a first one of the N heated baffles comprises a baffle body and a first pattern of bores through the baffle body. In other features, a second one of the N heated baffles is arranged adjacent to the first one of the N heated baffles and comprises a baffle body and a second pattern of bores through the baffle body.

In other features, the method includes misaligning the first pattern of bores through the baffle body of the first one of the N heated baffles relative the second pattern of bores through the baffle body of the first one of the N heated baffles. The method includes providing first and second flanges that extend axially outwardly from the baffle body of the first one of the N heated baffles.

In other features, the method includes providing a groove arranged around a periphery of the baffle body of the first one of the N heated baffles and arranging a heater coil in the groove.

In other features, the method includes providing a bore at center of the baffle body of the first one of the N heated baffles and passing a conduit to supply the carrier gas in the bore.

A vaporization system for liquid precursor includes a bubbler portion comprising a body to store liquid precursor and a conduit to supply carrier gas into the liquid precursor to vaporize the liquid precursor to generate vaporized precursor. A baffle portion is arranged in fluid communication with the bubbler portion and includes N heated baffles. The vaporized precursor generated by the bubbler portion passes through the N heated baffles before flowing to a substrate processing system, wherein N is an integer greater than one. Each of the N heated baffles comprises a temperature sensor and a heater. A porous medium is arranged adjacent to a bottom portion of the body. The carrier gas is delivered into a cavity between the porous medium and the bottom portion.

In other features, a controller is configured to control a temperature of each of the N heated baffles. The controller is configured to control a temperature the body of the bubbler portion.

In other features, the controller is configured to control the temperatures of each of the N heated baffles such that a first one of the N heated baffles has a first temperature that is less than a second temperature of a second one of the N heated baffles arranged immediately adjacent to the first one of the N heated baffles. In other features, the second temperature is less than a third temperature of a third one of the N heated baffles arranged immediately adjacent to the second one of the N heated baffles.

In other features, a bracket secures the porous medium in a spaced relationship with the bottom portion of the body.

In other features, a first one of the N heated baffles comprises a baffle body and a first pattern of bores through the baffle body. A second one of the N heated baffles is arranged adjacent to the first one of the N heated baffles and comprises a baffle body and a second pattern of bores through the baffle body. The first pattern of bores does not align with the second pattern of bores.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein:

FIG. 5A is a side view of an example heated baffle according to the present disclosure;

FIG. 5B is another side cross-sectional view of the example heated baffle according to the present disclosure;

FIG. 5C is a side cross-sectional view of the example heated baffle according to the present disclosure;

In the drawings, reference numbers may be reused to identify similar and/or identical elements.

DETAILED DESCRIPTION

Systems and methods for bulk vaporization of liquid precursor according to the present disclosure include a bubbler portion and a heated baffle portion. In some examples, the bubbler portion includes porous media that is used to distribute the carrier gas into the liquid precursor in a more uniform manner. The porous media allows a large surface area of contact between the liquid and the gas. At some point, the increase of the surface area of contact between the liquid and the gas will not cause increased vapor concentration because the liquid is in equilibrium for the temperature/pressure conditions (or saturated). In some examples, systems and methods for bulk vaporization of liquid precursor according to the present disclosure are designed to operate in the saturated region. The porous media will also create very small bubbles that are much less likely to splash and create a large amount of droplets.

The heated baffle portion includes one or more heated baffles that evaporate liquid transported by the vaporized precursor. Because the heated baffles are at a higher temperature than the bulk liquid in the bubbler portion, the vapor pressure curve is shifted back into the vapor region from the saturated region where the droplets are forming. In some examples, the systems and methods use multi-stage heated baffles with varying bore sizes and passage aspect ratios. In some examples, the heated baffles are operated at increasing temperature to allow suspended aerosol particles to be completely evaporated before leaving the device.

Figure 1:
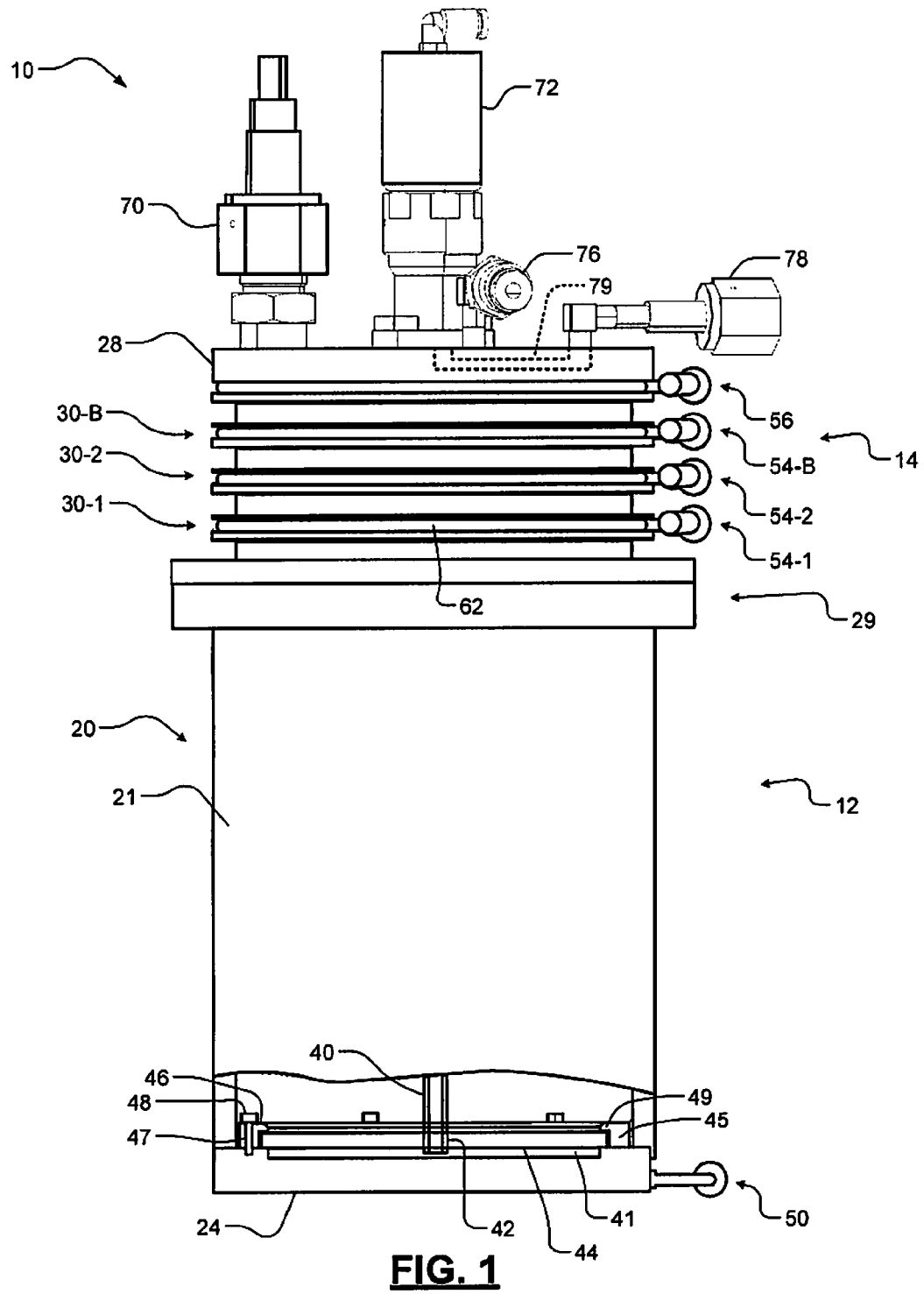
FIG. 1 is a side view of an example bulk vaporization system according to the present disclosure.
Figure 2:
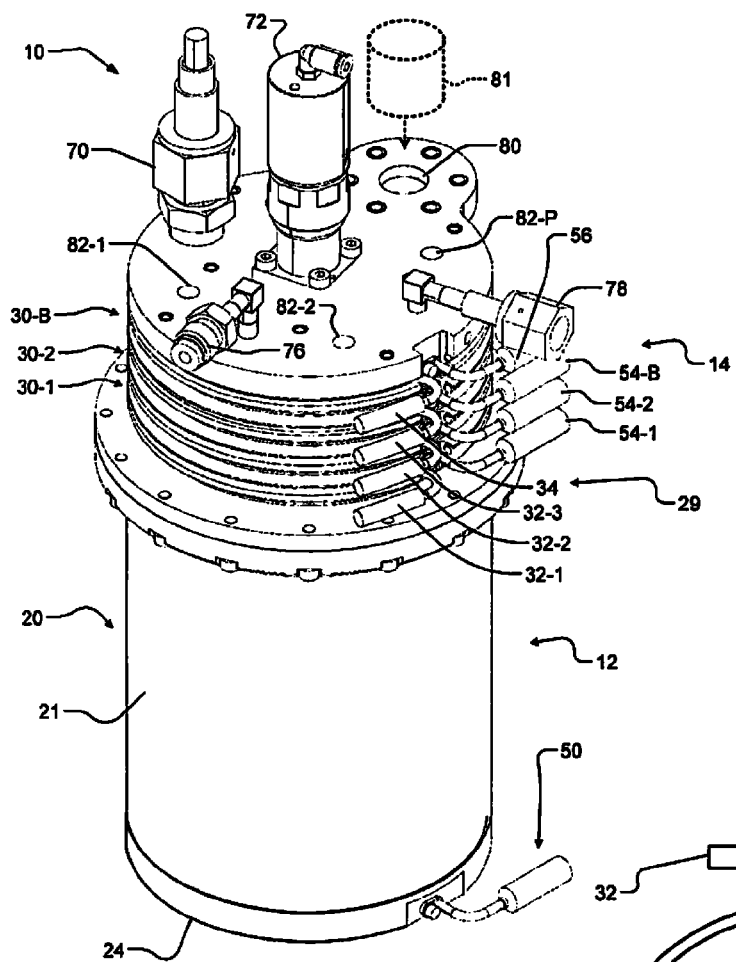
FIG. 2 is a perspective view of the example bulk vaporization system according to the present disclosure.

Referring now to FIGS. 1-2, an example bulk vaporization system 10 includes a bubbler portion 12 and a baffle portion 14. The bulk vaporization system 10 includes a body 20 that includes sidewalls 21 and a bottom portion 24, and a lid or top portion 28. A connection 29 may be arranged to connect the body 20 to the baffle portion 14 and to provide a seal therebetween. The baffle portion 14 includes baffles 30-1, 30-2, . . . , and 30-B (collectively baffles 30) that are arranged adjacent to one another, where B is an integer greater than or equal to one. The baffles 30 may be arranged between the lid 28 and the connection 29.

Liquid precursor is supplied to the body 20 as will be described below. A lower end 42 of a conduit 40 extends through the lid 28 and into a cavity 41. The carrier gas flows into liquid precursor located in the cavity 41 and then through the porous media 44. For example only, the porous media 44 may include a plate including spaced bores. The porous media 44 provides a porous separation between the cavity 41 and the rest of the body 20. For example only, the pore size may be approximately 20 µm. In some examples, the porous media 44 may be made from sintered stainless steel. One or more brackets 46 may be used to maintain a position of the porous media 44 relative to the cavity 41.

For example only, the bracket 46 may include an annular plate 45 having bores 47 passing through in an axial direction. The bores 47 may be spaced uniformly around the annular plate 45. Fasteners 48 such as threaded bolts may be inserted into bores 47 to attach the annular plate to the bottom portion 24. The annular plate 45 may include a radially inwardly projecting flange 49 located near an upper portion of the annular plate 45. The radially inwardly projecting flange 49 holds the porous media 44 in place above the cavity 41.

In some examples, a temperature of the bulk vaporization system 10 may be controlled. For example, the bottom portion may include a heater coil and connector assembly (not shown) to supply heat to the bottom portion 24. A thermocouple or temperature sensor 50 may be provided to monitor a temperature of the bottom portion 24. Likewise, the body 20 may be heated in a similar manner.

Figure 3:
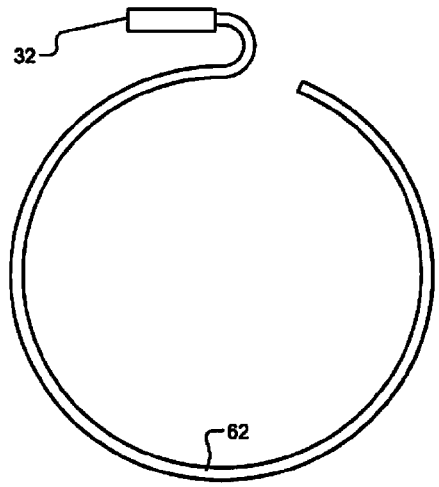
FIG. 3 is a plan view of a heater coil according to the present disclosure.

In FIG. 2, each of the baffles 30 may also include a corresponding heater coil and connector assembly 32-1, 32-2, . . . , and 32-B (collectively heater coil and connector assemblies 32). Thermocouple connector assemblies 54-1, 54-2, . . . , and 54-B (collectively thermocouple connector assemblies 54) and 56 may also be provided to monitor the temperature of each of the corresponding baffles 30 and the lid 28, respectively. Heater coils 62 may be arranged in grooves formed in the baffles 30 and/or other components such as the lid 28 or bottom portion 24. In FIG. 3, an example of the heater coil 62 is shown.

Referring back to FIGS. 1 and 2, various passages through the lid 28 are shown. A level sensor 70 may be arranged as shown to sense a level of liquid precursor in the body 20. Any suitable type of level sensor 70 may be used. For example only, an ultrasonic level sensor using crystals arranged at L levels may be used, where L is an integer greater than one. For example, L may be set to 4 and liquid precursor may be filled and maintained during normal operation to a level between the $2^{nd}$ and $3^{rd}$ level. An alarm or other signal may be generated if the level of the liquid precursor rises above the $3^{rd}$ level or reaches the $4^{th}$ level.

In some examples, a gas valve 72 may be arranged centrally relative to the lid 28 and gas may be supplied to the gas valve via a connector 78. The gas may flow through a passage 79 (FIG. 1) in the lid 28 and into an inlet of the gas valve 72. The passage 79 in the lid 28 pre-heats the gas as the gas enters the bulk vaporization system 10.

One or more additional valves may be connected to the connector 78 to control flow into the passage 79. The gas valve 72 includes an inlet that communicates with the passage 79 and an outlet that communicates with the body 20. A connector 76 may be used to deliver and/or remove liquid precursor to/from the body 20. One or more additional valves may be connected to the connector 76 to control flow through the connector 76.

A bore 80 in FIG. 2 receives a pressure sensor 81 or manometer to measure pressure in the body 20. In some examples, the pressure sensor 81 may be a capacitance-type manometer including a diaphragm, although other types of pressure sensors can be used. A plate is attached to the diaphragm. As the diaphragm moves under pressure, the plate moves relative to a stationary plate and the capacitance changes. The bore 80 extends through the lid 28 to allow the pressure sensor 81 to measure the pressure. In some examples, the pressure measurement area is in a region between an uppermost one of the baffle 30 and the lid 28 of the bulk vaporization system 10. However, the bore 80 may also extend through the baffles 30 into the body 20 if the pressure is to be measured in the body 20.

Figure 4:
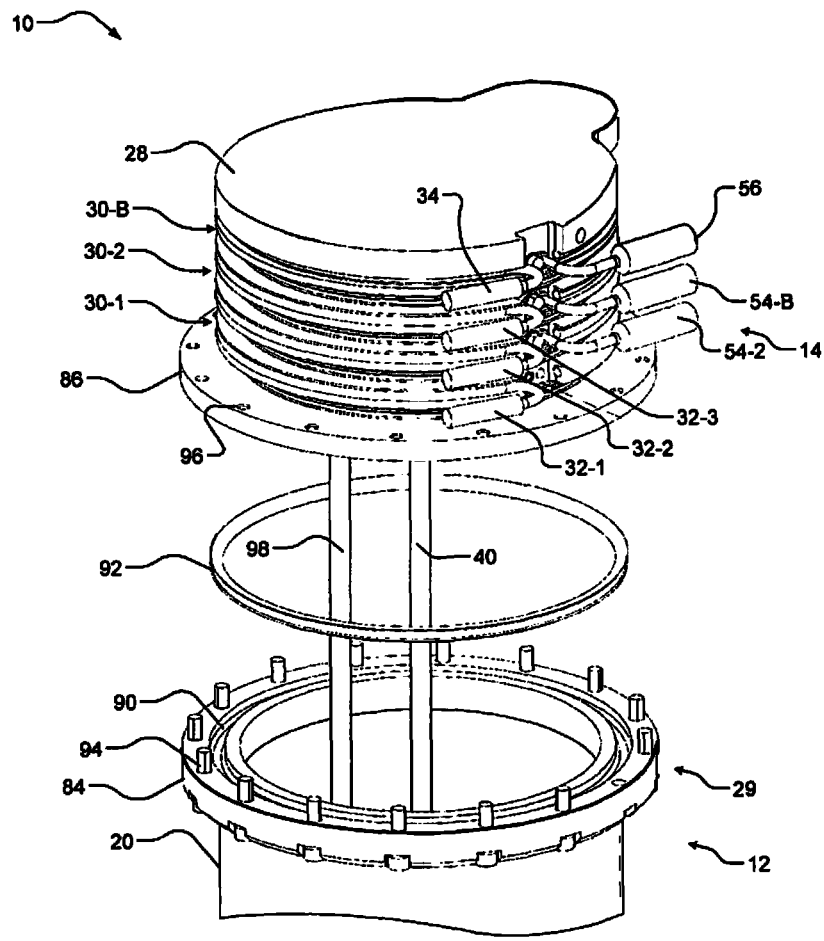
FIG. 4 is a partial exploded perspective view of the example bulk vaporization system according to the present disclosure.

In FIG. 4, the connection 29 is shown to include a bottom seal portion 84 connected to the body 20 and an upper seal portion 86 connected to the baffle portion 14. The bottom seal portion 84 defines a channel 90 to receive a seal 92 that mates with a corresponding flat surface provided by the upper seal portion 86. The channel 90 and the flat surface provided by the upper seal portion 86 control the compression of the seal 92.

In some examples, the seal 92 may be "C"-shaped, "V"-shaped, "O"-shaped "W"-shaped or have another cross-section. The seal 92 can also be eliminated by welding the assembly closed.

Fasteners may be provided to attach the bottom seal portion 84 to the upper seal portion 86. For example only, the fasteners may include threaded bolts or screws 94 that are inserted through the bottom seal portion 84 and that are received by corresponding bores 96 formed in the upper seal portion 86. Nuts or other fasteners may be connected to the bolts or screws 94. A second conduit 98 may be provided to supply or remove the liquid precursor into the body 20. The second conduit 98 may have one end connected to the connector 76.

In use, liquid precursor is supplied into the body 20 via the second conduit 98. Carrier gas is supplied via the conduit 40 into the cavity 41. The carrier gas creates bubbles that are further dispersed by the porous media 44 to provide more effective bubbling of the liquid precursor. Vaporization of the liquid precursor occurs and the vaporized precursor flows through holes 82-1, 82-2 . . . , 82-P (shown in FIG. 2) of the baffle portion 14 and is then supplied to one or more substrate processing systems. In some examples, temperatures of the baffles 30-1, 30-2 and 30-B are set to the same temperature, successively increasing temperatures, successively decreasing temperatures, or other temperature values.

Referring now to FIGS. 5A-5C, an example baffle 30 is shown. In FIG. 5A, the baffle 30 is shown to include a body 100. In some examples, the body 100 is circular shaped. For example, the body 100 has a diameter that is approximately equal to a diameter of the body 20. The body 100 defines a channel 104 on an outer surface or circumference thereof for receiving the heater coil 62. The body also defines an upper flange 110 and a lower flange 112. The upper and lower flanges 110 and 112 include projections that extend around an outer periphery of the body 100. A notch 116 in the body 100 provides a location for connecting a thermocouple.

In FIG. 5B, the baffle 30 defines a plurality of bores 130 that extend from a lower baffle surface 132 to an upper baffle surface 134. As can be seen in FIGS. 5B and 5C, the upper and lower flanges 110 and 112 are located around the upper and lower baffle surfaces 134 and 132. A bore 120 may be provided to allow the conduit 40 pass through the baffle plate.

In some examples, the bores 130 are arranged in a regular or irregular pattern. The bores may have the same size diameter or different size diameters. The bores may have the same aspect ratio or different aspect ratios. While the bores are shown arranged along radial lines and pass through the body in the same direction, the direction and alignment of the bores may be varied. The cross-section shown in FIG. 5B is located along one of the radial lines that includes the bores 130. In FIG. 5C, however, the cross-section is shown spaced from one of the radial lines that includes the bores.

Figure 5D:
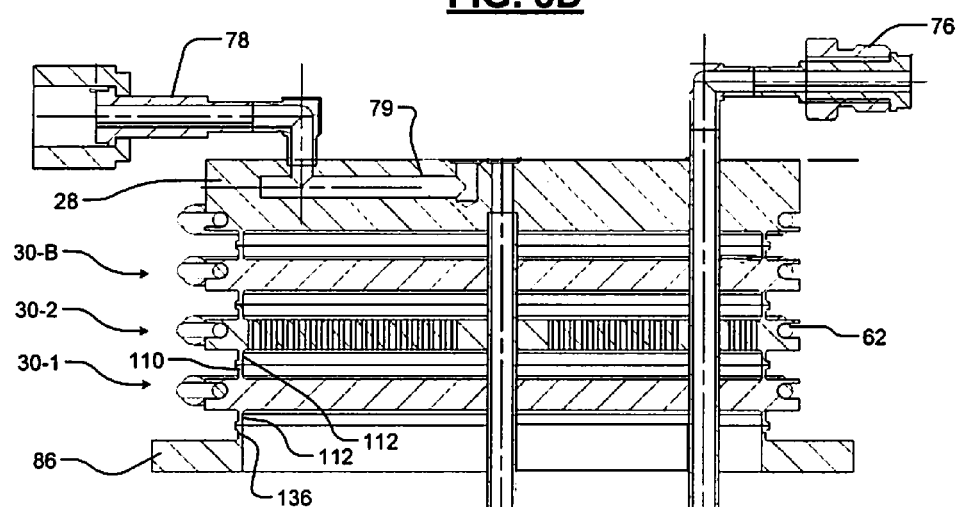
FIGS. 5D and 5E are cross-sectional views showing different portions of the baffle portion of the bulk vaporization system.
Figure 5E:
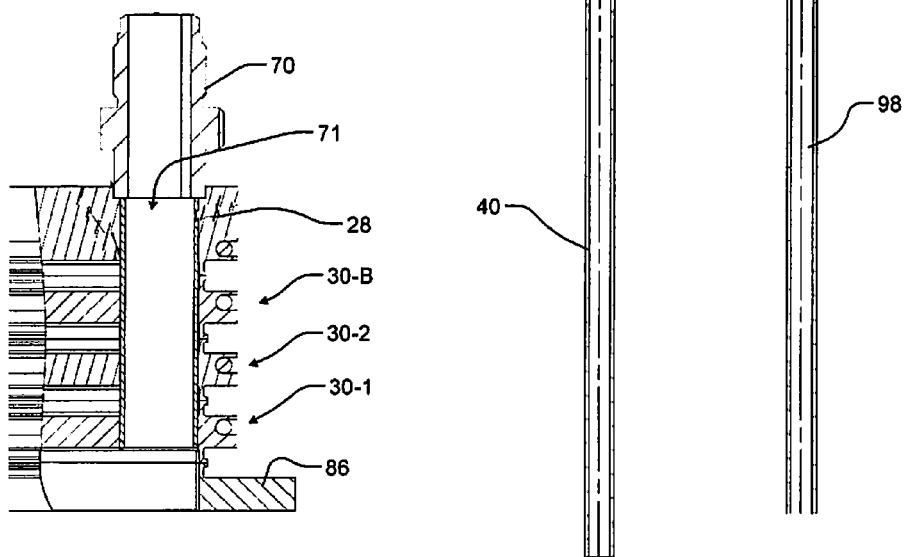

Referring now to FIGS. 5D and 5E, cross-sectional views of the baffle portion 14 of the bulk vaporization system 10 are shown. In FIG. 5D, the lower flange 112 of the baffle 30-1 is in contact with an axial flange 136 of the upper seal portion 86. The upper flange 110 of the baffle 30-1 is in contact with the lower flange 112 of the baffle 30-2. In other words, the upper and lower flanges 110 and 112 of adjacent baffles 30 may be welded or otherwise connected together to provide a vacuum seal. The limited contact area and spacing provided between the baffles provides thermal resistance to allow temperature differences to be created and maintained between the baffles. In FIG. 5E, a bore 71 associated with the level sensor 70 is shown extending through the lid 28 and the baffles 30 to a location above the upper seal portion 86.

Figure 6A:
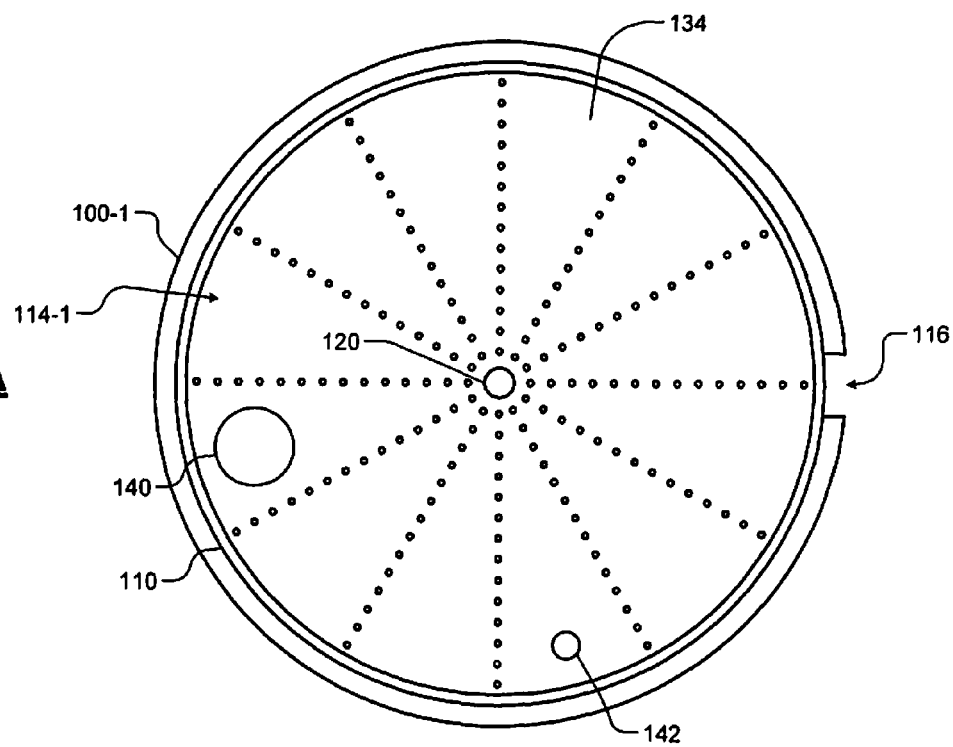
FIG. 6A is a plan view of an example heated baffle according to the present disclosure.
Figure 6B:
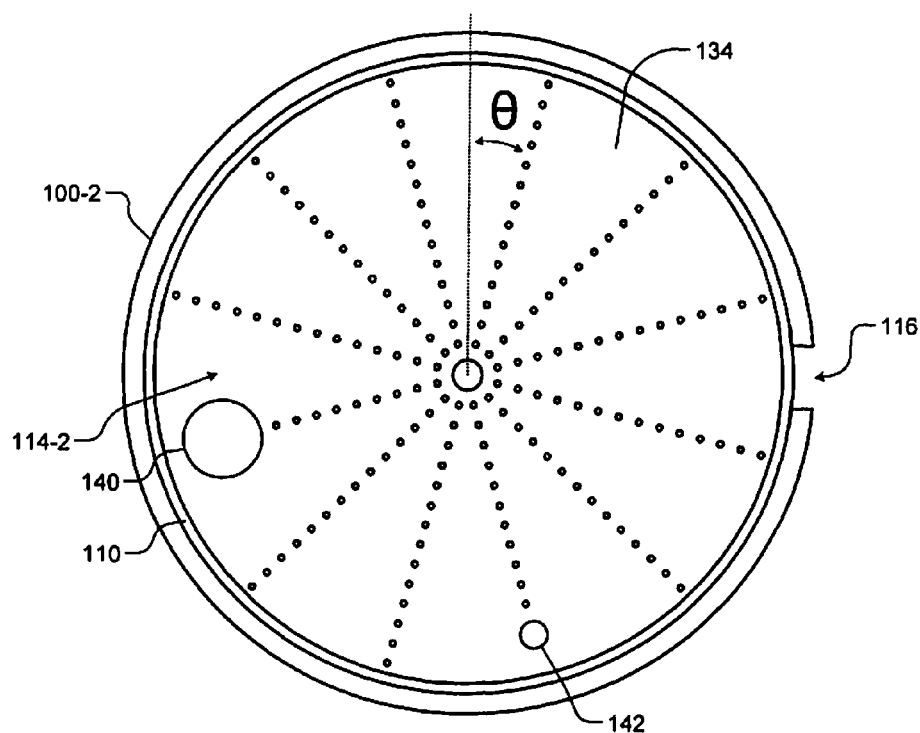
FIG. 6B is a plan view of another example heated baffle according to the present disclosure.

Referring now to FIGS. 6A-6B, examples of the baffles are shown. In FIG. 6A, the upper baffle surface 134 of a body 100-1 is shown. The body 100-1 includes a first pattern 114-1 of the bores 130. In this example, the first pattern 114-1 includes bores that are arranged in a regular pattern along radial lines of the body 100-1. The radial lines of bores are spaced at predetermined intervals or irregular intervals. For example, the radial lines of bores are spaced at 30° intervals. The body 100-1 also defines first and second bores 140 and 142. The bore 140 may be aligned with the bore 71 in the lid 28. The bore 142 may receive the second conduit 98.

In FIG. 6B, the upper baffle surface 134 of another body 100-2 is shown. The body 100-2 includes a second pattern 114-2 of the bores 130. The second pattern 114-2 of the bores 130 also includes bores that are arranged in a regular pattern along radial lines of the body 100-2. The radial lines of bores are also spaced at predetermined intervals. However, the second pattern 114-2 of bores 130 are rotated relative to the first pattern 114-1 of bores on the body 100-1 in FIG. 6A. In this example, the bores in FIG. 6B are rotated approximately 15° relative to the bores shown in the body 100-1. Some of the vapor flows through the baffles 30 without direct contact as it is a gas and many molecules will be entrained in the gas flow and will not contact the heated baffle surface. However, the convoluted path imparts direction changes in the gas flow that may have droplets entrained. The direction change uses the inertia of the droplets to cause the droplets to impinge upon the heated baffle surface. As a result, the droplets have a much lower probability of exiting the heated baffles.

Figure 7:
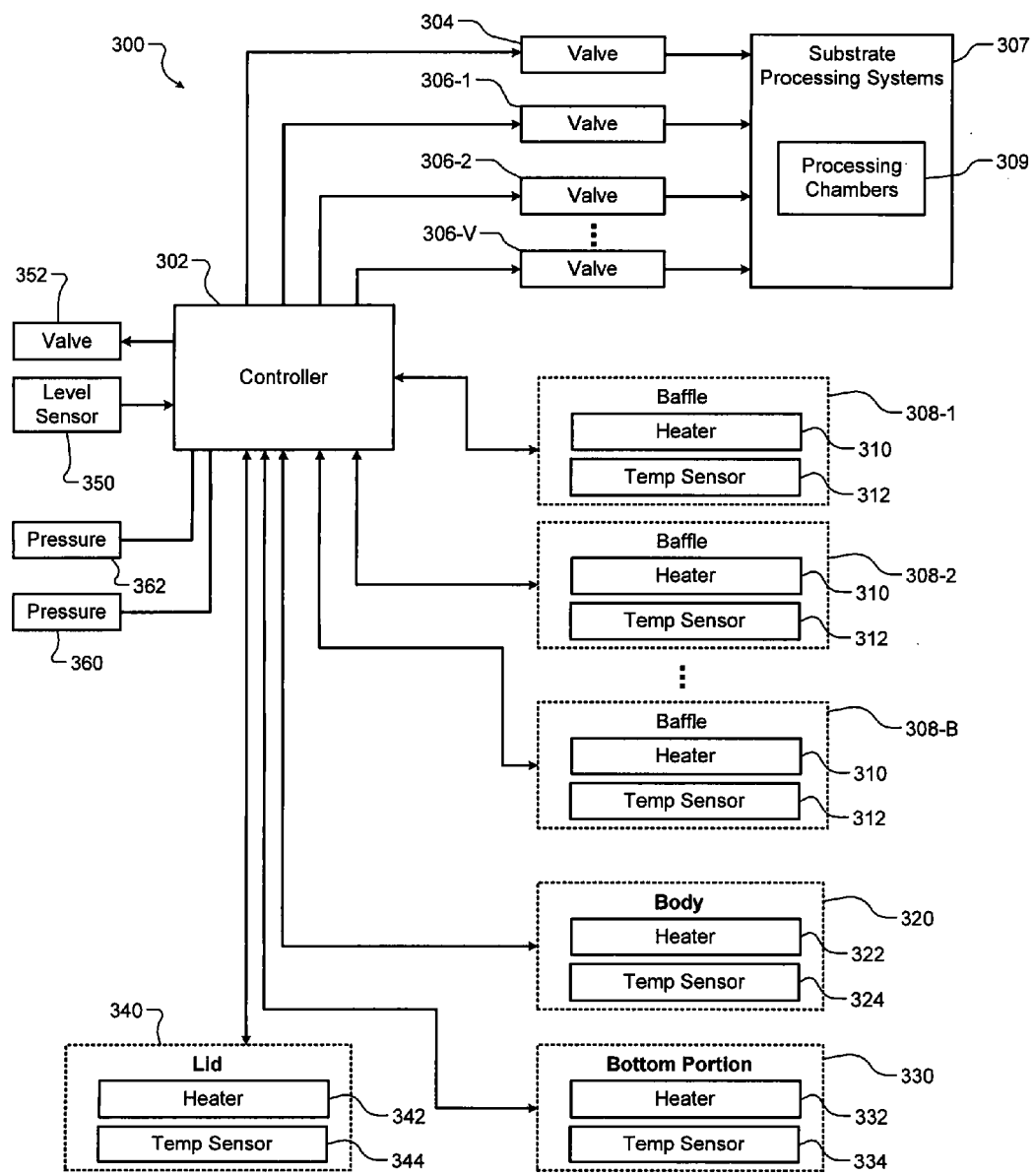
FIG. 7 is a functional block diagram of an example control system for controlling the bulk vaporization system according to the present disclosure.

Referring now to FIG. 7, a control system 300 for controlling the bulk vaporization system is shown. The control system 300 includes a controller 302. The controller 302 controls a valve 304 that supplies carrier gas. The controller 302 also controls operation of valves 306-1, 306-2, . . . , and 306-V (collectively valves 306), where V is an integer greater than or equal to one. The valves 306 supply vaporized precursor to corresponding substrate processing systems 307.

The controller 302 controls heating of baffles 308-1, 308-2, . . . , and 308-B (collectively baffles 308). The controller 302 receives a temperature signal from a temperature sensor 312 and supplies current to a heater coil 310 for each of the baffles 308. The controller 302 communicates with a heater 322 and temperature sensor 324 associated with the body 320. The controller 302 communicates with a heater 332 and temperature sensors 334 associated with a bottom portion 330.

The controller 302 also communicates with a heater 342 and temperature sensors 344 associated with a lid 340. The controller 302 receives a level of liquid precursor from a level sensor 350 and selectively controls a valve 352 to supply liquid precursor to the body. The controller 302 also receives pressure signals from pressure sensors 360 and 362, which measure system pressures. For example, one of the pressure sensors may sense pressure in the body region above the liquid and one of the pressure sensors may sense pressure in the exit region above the heated baffles. The use of two pressure sensors may help to identify clogging of the heated baffles. For example, clogging may be identified when a pressure differential exceeds a predetermined pressure differential.

While each of the baffles, body, bottom portion and/or lid are shown with individual temperature sensing and control, any two or more of these structures can be controlled as one zone. For example only, the body and the bottom portion may be controlled with a single temperature sensor and heaters connected in series as one zone.

Figure 8:
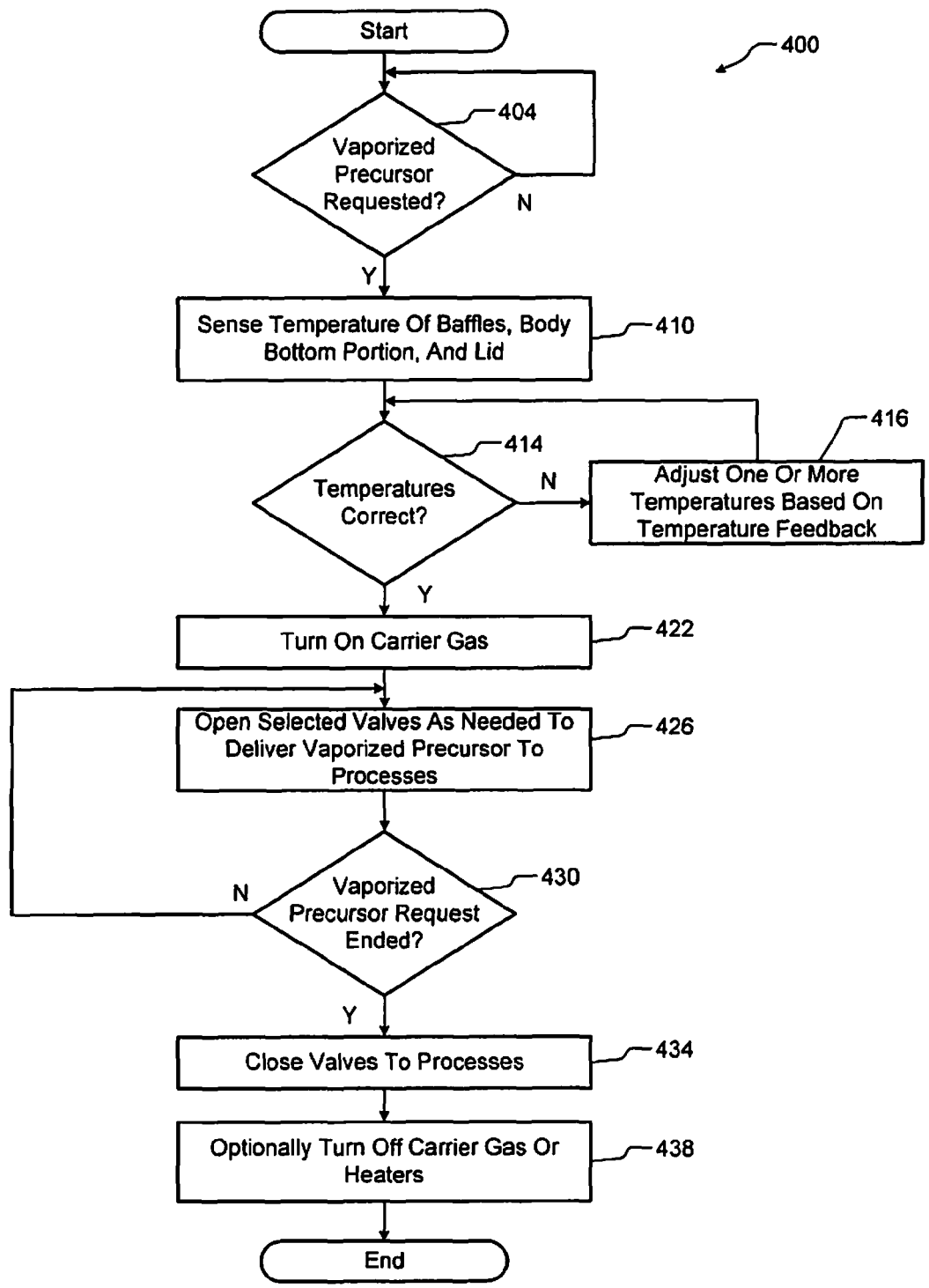
FIG. 8 illustrates a method for controlling the bulk vaporization system according to the present disclosure.

Referring now to FIG. 8, a method 400 for controlling the bulk vaporization system is shown. At 404, control determines whether there is a request for vaporized precursor. At 410, control senses a temperature of the baffles, body, bottom portion and/or lid. At 414, control determines whether the temperatures of the baffles, body, bottom surface and/or lid are correct. If not, control adjusts one or more temperatures based on the temperature feedback at 416. If the temperatures are correct at 414, control turns on the carrier gas at 422. Control may wait a predetermined period to allow vaporized precursor to build in the system. At 426, control opens selected valves as needed to deliver vaporized precursor to one or more processes. At 430, control determines whether the vaporized precursor request has ended. If not, control returns to 426. Otherwise, control closes one or more of the valves to the processes at 434. At 438, control optionally turns off the carrier gas or heaters as well. As can be appreciated, control may also monitor the level of liquid precursor in the body and selectively operate a valve to fill the body with the liquid precursor as needed.

In some examples, an output of the bulk vaporization system 10 is fed to four processing chambers (e.g., processing chambers 309 of the substrate processing systems 307 of FIG. 7). An output of the bulk vaporization system 10 is fed to charge volumes associated with each processing chamber. Pressure ramps up to a predetermined value and then a charge is delivered from the charge volumes to each processing chamber. Then, pressure ramps back up in each charge volume.

The systems and methods described herein produce a flow of uniform concentration of vaporized precursor from a bulk quantity of material. Since the systems and methods operate in a saturation region for the given material, flow increases, decreases, starts and stops provide relatively uniform vapor concentration. The systems and methods described herein also reduced defects and provide improved control of the concentration of the vaporized precursor.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. As used herein, the phrase at least one of A, B, and C should be construed to mean a logical (A or B or C), using a non-exclusive logical OR. It should be understood that one or more steps within a method may be executed in different order (or concurrently) without altering the principles of the present disclosure.

In this application, including the definitions below, the term controller may be replaced with the term circuit. The term controller may refer to, be part of, or include an Application Specific Integrated Circuit (ASIC); a digital, analog, or mixed analog/digital discrete circuit; a digital, analog, or mixed analog/digital integrated circuit; a combinational logic circuit; a field programmable gate array (FPGA); a processor (shared, dedicated, or group) that executes code; memory (shared, dedicated, or group) that stores code executed by a processor; other suitable hardware components that provide the described functionality; or a combination of some or all of the above, such as in a system-on-chip.

The term code, as used above, may include software, firmware, and/or microcode, and may refer to programs, routines, functions, classes, and/or objects. The term shared processor encompasses a single processor that executes some or all code from multiple controllers. The term group processor encompasses a processor that, in combination with additional processors, executes some or all code from one or more controllers. The term shared memory encompasses a single memory that stores some or all code from multiple controllers. The term group memory encompasses a memory that, in combination with additional memories, stores some or all code from one or more controllers. The term memory may be a subset of the term computer-readable medium. The term computer-readable medium does not encompass transitory electrical and electromagnetic signals propagating through a medium, and may therefore be considered tangible and non-transitory. Non-limiting examples of a non-transitory tangible computer readable medium include nonvolatile memory, volatile memory, magnetic storage, and optical storage.

The apparatuses and methods described in this application may be partially or fully implemented by one or more computer programs executed by one or more processors. The computer programs include processor-executable instructions that are stored on at least one non-transitory tangible computer readable medium. The computer programs may also include and/or rely on stored data.

What is claimed is:

1. A vaporization system for a liquid precursor, comprising:
a bubbler portion configured to store liquid precursor and supply carrier gas into the liquid precursor to vaporize the liquid precursor and generate vaporized precursor; and
a baffle portion arranged in fluid communication with the bubbler portion and including N heated baffles, wherein
N is an integer greater than one,
each of the N heated baffles comprises a channel that (i) faces outward away from a center of the baffle portion, and (ii) extends around a perimeter of a circumferential edge of a respective one of the N heated baffles, such that an open side of each of the channels receives a respective coil,
the open side of each of the channels extends around the perimeter of the respective one of the N heated baffles and is exposed to an area outside the N heated baffles,
each of the N heated baffles comprises a baffle plate and one or more flanges,
the one or more flanges of each of the N heated baffles project away from the corresponding one of the N heated baffles,
an adjacent pair of the N heated baffles comprises a first heated baffle and a second heated baffle,
the first heated baffle comprises a first flange,
the first flange projects downwardly from the first baffle,
the second heated baffle is disposed beneath the first baffle and comprises a second flange,
the second flange projects upwardly to and contacts the first flange, such that the first flange and the second flange separate opposing surfaces of the first heated baffle and the second heated baffle,
the coils transfer thermal energy to the N heated baffles, and
the vaporized precursor generated by the bubbler portion passes through the N heated baffles before flowing to a substrate processing system.

2. The vaporization system of claim 1, wherein each of the N heated baffles comprises a temperature sensor.

3. The vaporization system of claim 2, further comprising a controller configured to control a temperature of each of the N heated baffles based on a temperature signal from the corresponding one of the temperature sensors.

4. The vaporization system of claim 3, wherein the controller is configured to control a temperature of the bubbler portion.

5. The vaporization system of claim 3, wherein:
the controller is configured to control the temperatures of each of the N heated baffles such that a first one of the N heated baffles has a first temperature that is less than a second temperature of a second one of the N heated baffles arranged immediately adjacent to the first one of the N heated baffles; and
the second temperature is less than a third temperature of a third one of the N heated baffles arranged immediately adjacent to the second one of the N heated baffles.

6. The vaporization system of claim 1, wherein the bubbler portion comprises:
a body to store the liquid precursor;
a conduit to supply the carrier gas; and
a porous medium arranged adjacent to a bottom portion of the body to define a cavity, wherein the carrier gas is delivered into the cavity between the porous medium and the bottom portion.

7. The vaporization system of claim 6, further comprising a bracket to secure the porous medium in a spaced relationship with the bottom portion of the body to define the cavity.

8. The vaporization system of claim 1, wherein:
the baffle plate of the first heated baffle comprises a first pattern of bores;
the baffle plate of the second heated baffle is arranged adjacent to the baffle plate of the first heated baffle and comprises a second pattern of bores; and
the first pattern of bores does not align with the second pattern of bores.

9. The vaporization system of claim 8, wherein the first heated baffle further comprises a bore that is arranged at a center of the baffle plate of the first heated baffle and is configured to receive a conduit for the carrier gas.

10. A method for vaporizing a liquid precursor, comprising:
supplying liquid precursor to a body of a bubbler portion;
supplying carrier gas into the liquid precursor to vaporize the liquid precursor and to generate vaporized precursor;
arranging a baffle portion including N heated baffles in fluid communication with the bubbler portion to receive the vaporized precursor, where N is an integer greater than one, wherein
each of the N heated baffles comprises a channel that (i) faces outward away from a center of the baffle portion, and (ii) extends around a perimeter of a circumferential edge of a respective one of the N heated baffles, such that an open side of each of the channels receives a respective coil,
a portion of each of the coils extends around the perimeter of the respective one of the N heated baffles and is exposed, along the perimeter of the respective one of the N heated baffles, to an area outside of the N heated baffles when disposed in the corresponding one of the channels,
each of the N heated baffles comprises a baffle plate and one or more flanges,
the one or more flanges of each of the N heated baffles project away from the corresponding one of the N heated baffles,
an adjacent pair of the N heated baffles comprises a first heated baffle and a second heated baffle,
the first heated baffle comprises a first flange,
the first flange projects downwardly from the first baffle,
the second heated baffle is disposed beneath the first baffle and comprises a second flange,
the second flange projects upwardly to and contacts the first flange, such that the first flange and the second flange separate opposing surfaces of the first heated baffle and the second heated baffle, and
the coils transfer thermal energy to the N heated baffles; and
passing the vaporized precursor generated by the bubbler portion through the N heated baffles before flowing the vaporized precursor to a substrate processing system.

11. The method of claim 10, further comprising:
sensing a temperature of each of the N heated baffles; and
selectively heating each of the N heated baffles to control the temperature based on the sensed temperature.

12. The method of claim 11, further comprising controlling the temperatures of each of the N heated baffles, such that:
a first one of the N heated baffles has a first temperature that is less than a second temperature of a second one of the N heated baffles arranged immediately adjacent to the first one of the N heated baffles; and
the second temperature is less than a third temperature of a third one of the N heated baffles arranged immediately adjacent to the second one of the N heated baffles.

13. The method of claim 10, further comprising:
arranging a porous medium adjacent to a cavity at a bottom portion of the body; and
delivering the carrier gas into the cavity between the porous medium and the bottom portion.

14. The method of claim 13, further comprising securing the porous medium in a spaced relationship with the bottom portion of the body to define the cavity.

15. The method of claim 10, wherein:
the baffle plate of the first heated baffle comprises a first pattern of bores; and
the baffle plate of the second heated baffle is arranged adjacent to the first heated baffle and comprises a second pattern of bores.

16. The method of claim 15, further comprising misaligning the first pattern of bores through the baffle plate of the first heated baffle relative to the second pattern of bores.

17. The method of claim 15, further comprising:
providing a bore at center of the baffle plate of the first heated baffle; and
passing a conduit to supply the carrier gas in the bore.

18. A vaporization system for a liquid precursor, comprising:
a bubbler portion comprising
a body to store liquid precursor, and
a conduit to supply carrier gas into the liquid precursor to vaporize the liquid precursor to generate vaporized precursor;
a baffle portion arranged in fluid communication with the bubbler portion and including N heated baffles, where N is an integer greater than one, wherein each of the N heated baffles comprises (i) a temperature sensor, and (ii) a channel that (a) faces outward away from a center of the baffle portion, and (b) extends around a perimeter of a circumferential edge of a respective one of the N heated baffles, such that an open side of each of the channels receives a respective one of a plurality of heaters, wherein
each of the N heated baffles comprises a baffle plate and one or more flanges,
the one or more flanges of each of the N heated baffles project away from the corresponding one of the N heated baffles,
an adjacent pair of the N heated baffles comprises a first heated baffle and a second heated baffle,
the first heated baffle comprises a first flange,
the first flange projects downwardly from the first baffle,
the second heated baffle is disposed beneath the first baffle and comprises a second flange,
the second flange projects upwardly to and contacts the first flange, such that the first flange and the second flange separate opposing surfaces of the first heated baffle and the second heated baffle, and
the vaporized precursor generated by the bubbler portion passes through the N heated baffles before flowing to a substrate processing system; and
a porous medium arranged adjacent to a bottom portion of the body, wherein the carrier gas is delivered into a cavity between the porous medium and the bottom portion.

19. The vaporization system of claim 18, further comprising a controller configured to control a temperature of each of the N heated baffles.

20. The vaporization system of claim 19, wherein the controller is configured to control a temperature of the body of the bubbler portion based on temperature signals from the temperature sensors.

21. The vaporization system of claim 20, wherein the controller is configured to control a temperature of each of the N heated baffles based on temperature signals from the temperature sensors, such that:

a first one of the N heated baffles has a first temperature that is less than a second temperature of a second one of the N heated baffles arranged immediately adjacent to the first one of the N heated baffles; and the second temperature is less than a third temperature of a third one of the N heated baffles arranged immediately adjacent to the second one of the N heated baffles.

22. The vaporization system of claim 18, further comprising a bracket to secure the porous medium in a spaced relationship with the bottom portion of the body.

23. The vaporization system of claim 18, wherein:
the baffle plate of the first heated baffle comprises a first pattern of bores;
the baffle plate of the second heated baffle is arranged adjacent to the baffle plate of the first heated baffle and comprises a second pattern of bores; and
the first pattern of bores does not align with the second pattern of bores.

24. The vaporization system of claim 1, wherein each of the coils includes only a single loop.

25. The vaporization system of claim 1, wherein a portion of each of the coils extends around the perimeter of the respective one of the N heated baffles and is exposed, along the perimeter of the respective one of the N heated baffles, to an area outside of the N heated baffles when disposed in the corresponding one of the channels.

26. The vaporization system of claim 1, wherein the substrate processing system is separate from the vaporization system.

27. The vaporization system of claim 1, further comprising a plurality of valves configured to, when in an open state, permit passage of precursor gas from the vaporization system to a plurality of processing chambers.

28. The method of claim 10, wherein the channels are 'U'-shaped channels and are not fully enclosed by the N heated baffles, such that the open sides of the channels are exposed to the area outside of the N heated baffles along the perimeters of the N heated baffles.

29. The vaporization system of claim 1, further comprising:
a plurality of connector assemblies, wherein each of the connector assemblies is connected to a respective one of the coils,
a plurality of thermocouple assemblies configured to detect temperatures respectively of the N heated baffles; and
a controller configured to
monitor the temperatures of the N heated baffles via the plurality of thermocouple assemblies, and
independently control temperatures of the coils by controlling supply of current to the coils via the plurality of connector assemblies.

30. The vaporization system of claim 1, wherein the flanges of the N heated baffles are integrally formed as part of the N heated baffles.

31. The vaporization system of claim 1, wherein the flanges of the N heated baffles are disposed radially inward of the channels of the N heated baffles.

32. The vaporization system of claim 18, wherein the flanges of the N heated baffles are integrally formed as part of the N heated baffles.

33. The vaporization system of claim 18, wherein the flanges of the N heated baffles are disposed radially inward of the channels of the N heated baffles.

* * * * *